US012677565B2

(12) United States Patent
Jung et al.

(10) Patent No.: US 12,677,565 B2
(45) Date of Patent: Jul. 7, 2026

(54) DISPLAY DEVICE AND METHOD FOR MANUFACTURING THE SAME

(71) Applicant: Samsung Display Co., Ltd., Yongin-Si (KR)

(72) Inventors: Yang-Ho Jung, Yongin-si (KR); Woong Sik Kim, Yongin-si (KR); Kab Jong Seo, Yongin-si (KR); Jun Ho Sim, Yongin-si (KR); Pil Soon Hong, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 393 days.

(21) Appl. No.: 18/136,951

(22) Filed: Apr. 20, 2023

(65) Prior Publication Data

US 2024/0008341 A1 Jan. 4, 2024

(30) Foreign Application Priority Data

Jul. 4, 2022 (KR) ........................ 10-2022-0081821

(51) Int. Cl.
| | |
|---|---|
| *H10K 59/80* | (2023.01) |
| *H10K 59/12* | (2023.01) |
| *H10K 59/124* | (2023.01) |

(52) U.S. Cl.
CPC ... *H10K 59/80517* (2023.02); *H10K 59/1201* (2023.02); *H10K 59/124* (2023.02); *H10K 59/877* (2023.02)

(58) Field of Classification Search
CPC ....... H10K 59/80517; H10K 59/80515; H10K 71/621; H10K 59/877; H10K 59/805;
H10K 71/00; H10K 71/60; H10K 50/854; H10K 59/10–221; H10K 59/131–1315; G09F 9/335; H05K 2201/10136
See application file for complete search history.

(56) References Cited

U.S. PATENT DOCUMENTS

| | | | |
|---|---|---|---|
| 2016/0126501 A1 | 5/2016 | Kim et al. | |
| 2017/0084870 A1 | 3/2017 | Choi et al. | |
| 2019/0311933 A1* | 10/2019 | White | ................. H01L 21/6833 |
| 2021/0057501 A1 | 2/2021 | Zhou | |
| 2021/0104586 A1* | 4/2021 | Baek | ................. H10H 20/8515 |

FOREIGN PATENT DOCUMENTS

| | | | | |
|---|---|---|---|---|
| CN | 112397555 A | * | 2/2021 | ....... H10K 59/80518 |
| KR | 10-1468972 B1 | | 12/2014 | |
| KR | 10-2016-0050848 A | | 5/2016 | |
| KR | 10-2017-0036876 A | | 4/2017 | |
| KR | 10-2021-0022206 A | | 3/2021 | |
| KR | 10-2021-0042195 A | | 4/2021 | |
| KR | 10-2323281 B1 | | 11/2021 | |
| KR | 10-2329809 B1 | | 11/2021 | |

* cited by examiner

*Primary Examiner* — Shahed Ahmed
(74) *Attorney, Agent, or Firm* — Innovation Counsel LLP

(57) ABSTRACT

A present disclosure relates to a display device and a manufacturing method, and the display device according to an embodiment includes: a substrate; a transistor positioned on the substrate; a first pixel electrode connected to the transistor; a scattering layer positioned on the first pixel electrode; a second pixel electrode positioned on the scattering layer and covering a side surface of the first pixel electrode; an emission layer positioned on the second pixel electrode; and a common electrode positioned on the emission layer.

10 Claims, 24 Drawing Sheets

351
195
191/193

181

DISPLAY DEVICE AND METHOD FOR MANUFACTURING THE SAME

CROSS-REFERENCE TO RELATED APPLICATION

This application claims priority to and the benefit of Korean Patent Application No. 10-2022-0081821 filed in the Korean Intellectual Property Office on Jul. 4, 2022, the entire contents of which are incorporated herein by reference.

BACKGROUND

1. Field

The present disclosure relates to a display device and a manufacturing method thereof.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

The organic light emitting display has a self-luminance characteristic, and unlike the liquid crystal display, a separate light source is not required, so thickness and weight may be reduced. In addition, the organic light emitting display has high quality characteristics such as low power consumption, high luminance, and fast response speed.

The above information disclosed in this Background section is only for enhancement of understanding of the background of the described technology, and therefore it may contain information that does not form the prior art that is already known in this country to a person of ordinary skill in the art.

SUMMARY

Embodiments are to provide a display device capable of improving a viewing angle and a manufacturing method thereof.

A display device according to an embodiment includes: a substrate; a transistor positioned on the substrate; a first pixel electrode connected to the transistor; a scattering layer positioned on the first pixel electrode; a second pixel electrode positioned on the scattering layer and covering a side surface of the first pixel electrode; an emission layer positioned on the second pixel electrode; and a common electrode positioned on the emission layer.

The second pixel electrode may be in direct contact with the side surface of the first pixel electrode.

The second pixel electrode may have a wider width than that of the first pixel electrode.

The scattering layer may have the same planar shape as the first pixel electrode.

The display device according to an embodiment may further include a passivation layer positioned between the transistor and the first pixel electrode, wherein an edge of the second pixel electrode may be in direct contact with the passivation layer.

The second pixel electrode may be in direct contact with an upper surface and side surfaces of the first pixel electrode not covered by the scattering layer.

The passivation layer may include a trench, a thickness of a part of the passivation layer where the trench is formed may be thinner than a thickness of the rest of the passivation layer, the trench may not overlap the first pixel electrode, and the edge of the second pixel electrode may cover a side wall and a bottom of the trench.

A width of the scattering layer may be narrower than the width of the first pixel electrode.

The first pixel electrode may include a lower layer, a middle layer, and an upper layer, the middle layer may include a metal material, and the lower layer and the upper layer may include a transparent conductive oxide.

The scattering layer may include a photosensitive resin, and a plurality of scatterers positioned inside the photosensitive resin.

A manufacturing method of a display device according to an embodiment includes: forming a transistor on a substrate; forming a passivation layer on the transistor; forming a pixel electrode material layer connected to the transistor on the passivation layer; forming a scattering layer on the pixel electrode material layer; patterning the pixel electrode material layer by using the scattering layer as a mask to form a first pixel electrode; forming a second pixel electrode in contact with the first pixel electrode on the scattering layer; forming an emission layer on the second pixel electrode; and forming a common electrode on the emission layer.

In the forming of the second pixel electrode, the second pixel electrode may be formed to cover a side surface of the first pixel electrode.

The second pixel electrode may have a wider width than that of the first pixel electrode.

The first pixel electrode may have the same planar shape as the scattering layer.

In the forming of the scattering layer, the scattering layer may be formed to include a first portion having a first thickness and a second portion having a second thickness, the first thickness may be thicker than the second thickness, and the first portion may be surrounded by the second portion.

The manufacturing method of the display device according to an embodiment may further include, after forming the first pixel electrode, removing the second portion of the scattering layer by performing an etch-back process, and the second pixel electrode may be in contact with an upper surface and side surfaces of the first pixel electrode not covered by the scattering layer.

Before removing the second portion of the scattering layer, the scattering layer and the first pixel electrode may have the same planar shape, and after removing the second portion of the scattering layer, a width of the scattering layer may become narrower than the width of the first pixel electrode.

In the removing of the second portion of the scattering layer, the thickness of the first portion of the scattering layer may decrease, and a trench may be formed in a portion of the passivation layer not covered by the first pixel electrode.

The first pixel electrode may include a lower layer, a middle layer, and an upper layer, the middle layer may include a metal material, and the lower layer and the upper layer may include a transparent conductive oxide.

In the forming of the scattering layer, a photosensitive resin material including a plurality of scatterers may be formed and a photo process may be performed to form the scattering layer.

According to embodiments, the viewing angle of the display device may be improved.

DETAILED DESCRIPTION

Figure 1:
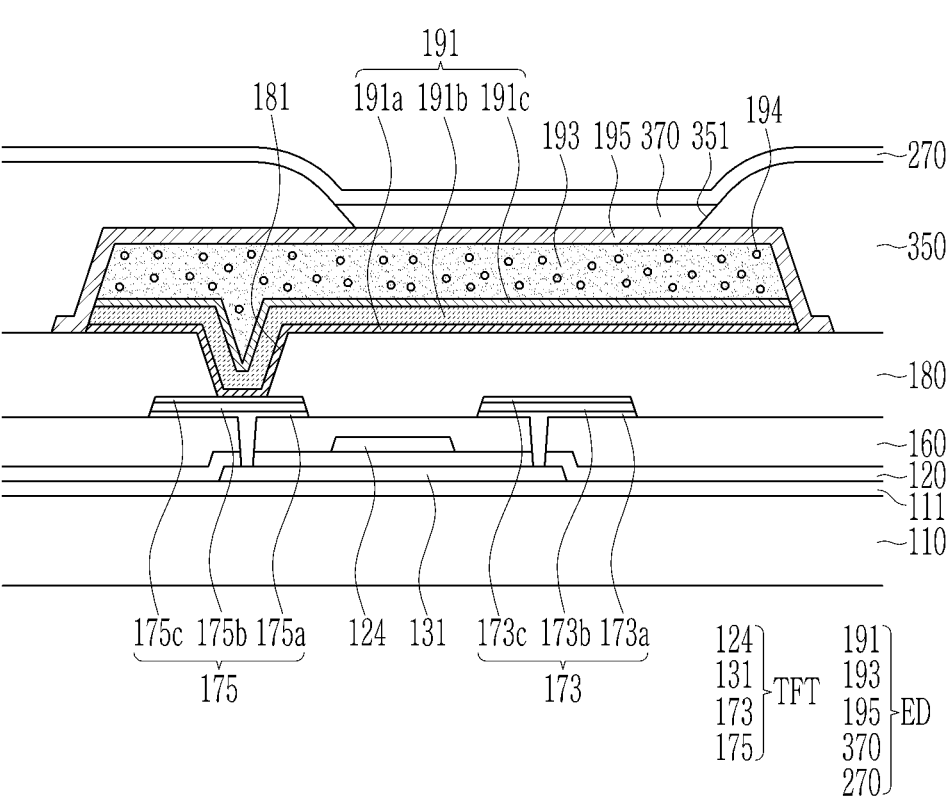
FIG. 1 is a cross-sectional view showing a display device according to an embodiment.

The present inventive concept will be described more fully hereinafter with reference to the accompanying drawings, in which embodiments of the inventive concept are shown. As those skilled in the art would realize, the described embodiments may be modified in various different ways, all without departing from the spirit or scope of the present inventive concept.

In order to clarify the present inventive concept, parts that are not connected with the description will be omitted, and the same elements or equivalents are referred to by the same reference numerals throughout the specification.

Further, since sizes and thicknesses of constituent members shown in the accompanying drawings are arbitrarily given for better understanding and ease of description, the present inventive concept is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, in the specification, the phrase "on a plane" or "in a plan view" means when an object portion is viewed from above, and the phrase "on a cross-section" or "in a cross-sectional view" means when a cross-section taken by vertically cutting an object portion is viewed from the side.

Hereinafter, a display device according to an embodiment is described with reference to FIG. 1 as follows.

FIG. 1 is a cross-sectional view of a display device according to an embodiment.

As shown in FIG. 1, a display device according to an embodiment includes a substrate 110, a transistor TFT positioned on the substrate 110, and a light-emitting element ED connected to the transistor TFT.

The substrate 110 may be a rigid substrate or a flexible substrate capable of bending, folding, rolling, etc. For example, the substrate 110 may include a material such as polystyrene, polyvinyl alcohol, polymethylmethacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, etc. The substrate 110 may be single-layered or multi-layered. The substrate 110 may have a structure in which at least one base layer and at least one inorganic layer, including a polymer resin sequentially stacked, are alternately stacked.

On the substrate 110, a buffer layer 111 for flattening the surface of the substrate 110 and blocking penetration of impurities may be further positioned. The buffer layer 111 may include an inorganic insulating material or an organic insulating material such as a silicon nitride ($SiN_x$), a silicon oxide ($SiO_x$), or a silicon oxynitride ($SiO_xN_y$). The buffer layer 111 may have single-layered or multi-layered structure. In addition, a barrier layer (not shown) may be further positioned on the substrate 110. In this case, the barrier layer may be positioned between the substrate 110 and the buffer layer 111. The barrier layer may include an inorganic insulating material such as a silicon nitride ($SiN_x$), a silicon oxide ($SiO_x$), or a silicon oxynitride ($SiO_xN_y$). The barrier layer may have a single-layered or multi-layered structure including the material.

A semiconductor 131 may be positioned on the buffer layer 111. The semiconductor 131 may include any one of amorphous silicon, polycrystalline silicon, and an oxide semiconductor. For example, the semiconductor 131 may include low temperature polysilicon (LTPS) or an oxide semiconductor material including at least one of zinc (Zn), indium (In), gallium (Ga), tin (Sn) and a mixture thereof. For example, the semiconductor 131 may include Indium-Gallium-Zinc Oxide (IGZO). The semiconductor 131 may include a channel region, a first region, and a second region classified according to whether or not impurity doping is performed. The first region and the second region may be positioned on both sides of the channel region of the semiconductor 131, respectively. The first region and the second region may have conduction characteristics corresponding to conductors.

A gate insulating layer 120 may be positioned on the semiconductor 131. The gate insulating layer 120 may cover the semiconductor 131 and the substrate 110. The gate insulating layer 120 may include an inorganic insulating material such as a silicon nitride ($SiN_x$), a silicon oxide ($SiO_x$), or a silicon oxynitride ($SiO_xN_y$). The gate insulating layer 120 may have a single-layered or multi-layered structure of the material.

The gate electrode 124 may be positioned on the gate insulating layer 120. The gate electrode 124 may overlap at least a portion of the semiconductor 131. The gate electrode 124 may include a metal or a metal alloy such as copper (Cu), molybdenum (Mo), aluminum (Al), silver (Ag), chromium (Cr), tantalum (Ta), or titanium (Ti). The gate electrode 124 may be configured as a single layer or multiple layers. For example, the gate electrode 124 may have a double layer, and may include a layer including aluminum (Al) and a layer including titanium (Ti).

After forming the gate electrode 124, a doping process or a plasma treatment may be performed. The part of the semiconductor 131 that is covered by the gate electrode 124 is not doped or plasma treated, and the part of the semiconductor 131 that is not covered by the gate electrode 124 is doped or treated with plasma to give electrical conductivity.

A region of the semiconductor 131 that overlaps the gate electrode 124 on a plane may be a channel region.

An interlayer insulating layer 160 may be positioned on the gate electrode 124. The interlayer insulating layer 160 may cover the gate electrode 124 and the gate insulating layer 120. The interlayer insulating layer 160 may include an inorganic insulating material such as a silicon nitride (SiNx), a silicon oxide (SiOx), or a silicon oxynitride (SiOxNy). The interlayer insulating layer 160 may have a single-layered or multi-layered structure of the material.

A source electrode 173 and a drain electrode 175 may be positioned on the interlayer insulating layer 160. The source electrode 173 and the drain electrode 175 are connected to the first region and the second region of the semiconductor 131 through contact holes formed in the interlayer insulating layer 160 and the gate insulating layer 120, respectively. Accordingly, the semiconductor 131, the gate electrode 124, the source electrode 173, and the drain electrode 175 described above constitute one transistor TFT. According to an embodiment, the transistor TFT may include only the first region and the second region of the semiconductor 131 instead of the source electrode 173 and the drain electrode 175. FIG. 1 shows one transistor TFT, the display device according to an embodiment may include a plurality of pixels, and each of a plurality of pixels may include a plurality of transistors TFT.

The source electrode 173 and the drain electrode 175 may include aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), as a metal or a metal alloy. The source electrode 173 and the drain electrode 175 may be configured as a single layer or multiple layers. For example, the source electrode 173 may be formed of a triple layer including a lower layer 173a, a middle layer 173b, and an upper layer 173c. In this case, the lower layer 173a and the upper layer 173c of the source electrode 173 may include titanium (Ti), and the middle layer 173b may include aluminum (Al). The drain electrode 175 may be formed of a triple layer including a lower layer 175a, a middle layer 175b, and an upper layer 175c. In this case, the lower layer 175a and the upper layer 175c of the drain electrode 175 may include titanium (Ti), and the middle layer 175b may include aluminum (Al).

A passivation layer 180 may be positioned on the source electrode 173 and the drain electrode 175. The passivation layer 180 covers the source electrode 173, the drain electrode 175, and the interlayer insulating layer 160. The passivation layer 180 may planarizing the surface of the substrate 110 on which the transistor TFT is formed, and may be an organic insulator. The passivation layer 180 may include an organic insulating material such as a general purpose polymer such as poly(methyl methacrylate) or polystyrene, a polymer derivative having a phenolic group, an acryl-based polymer, an imide polymer, a polyimide, an acryl-based polymer, and a siloxane-based polymer.

The light-emitting element ED may be positioned on the passivation layer 180. The light-emitting element ED may be connected to the transistor TFT. The light-emitting element ED may include a first pixel electrode 191, a second pixel electrode 195, an emission layer 370, and a common electrode 270. The light-emitting element ED may further include a scattering layer 193 positioned between the first pixel electrode 191 and the second pixel electrode 195.

The first pixel electrode 191 may be positioned on the passivation layer 180. The first pixel electrode 191 may be configured as a single layer including a transparent conductive oxide or a metal material, or as a multi-layer including the same. The transparent conductive oxide may include ITO (Indium Tin Oxide), poly-ITO, IZO (Indium Zinc Oxide), IGZO (Indium Gallium Zinc Oxide), ITZO (Indium Tin Zinc Oxide), etc. The metal material may include silver (Ag), molybdenum (Mo), copper (Cu), gold (Au), and aluminum (Al). For example, the first pixel electrode 191 may include a lower layer 191a, a middle layer 191b, and an upper layer 191c. The lower layer 191a of the first pixel electrode 191 may be positioned on the passivation layer 180, the middle layer 191b may be positioned on the lower layer 191a, and the upper layer 191c may be positioned on the middle layer 191b. In this case, the middle layer 191b of the first pixel electrode 191 may be made of a different material from that of the lower layer 191a and the upper layer 191c. For example, the middle layer 191b may be made of silver (Ag), and the lower layer 191a and the upper layer 191c may be made of ITO.

The passivation layer 180 may include a contact hole 181 exposing the drain electrode 175. The first pixel electrode 191 may be connected to the drain electrode 175 through the contact hole 181. Accordingly, the first pixel electrode 191 may be connected to the transistor TFT. In this case, the lower layer 191a of the first pixel electrode 191 and the upper layer 175c of the drain electrode 175 may be in contact with each other.

The scattering layer 193 may be positioned on the first pixel electrode 191. The scattering layer 193 may be positioned directly on the upper layer 191c of the first pixel electrode 191 and may be in direct contact with the upper layer 191c of the first pixel electrode 191. The first pixel electrode 191 may be patterned using the scattering layer 193 as a mask. Accordingly, the scattering layer 193 may have substantially the same planar shape as the first pixel electrode 191. The scattering layer 193 may include a photosensitive resin and a scatterer 194. A plurality of scatterers 194 may be positioned inside the photosensitive resin and may be evenly distributed. The scatterer 194 may include a material such as $TiO_2$, $SiO_2$, $BaSO_4$, $ZnO$, $Al_2O_3$, and $CaCO_3$. The display device according to an embodiment may change the light path by the scattering layer 193 including the scatterers 194. By scattering the light incident on the scattering layer 193, the viewing angle may be improved.

A second pixel electrode 195 may be positioned on the scattering layer 193. The second pixel electrode 195 may cover an upper surface and a side surface of the scattering layer 193. The second pixel electrode 195 may be positioned directly on the scattering layer 193 and may be in direct contact with the scattering layer 193. Also, the second pixel electrode 195 may cover a side surface of the first pixel electrode 191. The second pixel electrode 195 may be in direct contact with the first pixel electrode 191. The second pixel electrode 195 may have a wider width than the first pixel electrode 191 and the scattering layer 193. The edge of the second pixel electrode 195 may be positioned directly on the passivation layer 180. The second pixel electrode 195 may include a transparent conductive oxide such as Indium Tin Oxide (ITO), poly-ITO, Indium Zinc Oxide (IZO), Indium Gallium Zinc Oxide (IGZO), and Indium Tin Zinc Oxide (ITZO).

A partition wall 350 may be positioned on the second pixel electrode 195. The partition wall 350 is also referred to as a pixel defining layer (PDL), and includes a pixel opening 351 exposing at least a portion of the second pixel electrode 195. The pixel opening 351 may overlap the first pixel electrode 191 and the scattering layer 193 in a plan view. In this case, the pixel opening 351 may overlap the central portions of the first pixel electrode 191, the scattering layer 193, and the second pixel electrode 195 in a plan view, and may not overlap the edge portions of the first pixel electrode 191, the scattering layer 193, and the second pixel electrode 195. Accordingly, the size of the pixel opening 351 on the plane may be smaller than the size of the first pixel electrode 191, the scattering layer 193, and the second pixel electrode 195 on the plane. The partition wall 350 may be an organic insulator including at least one material selected from a group consisting of polyimide, polyamide, acryl resin, benzocyclobutene, and phenol resin. Alternatively, the partition wall 350 may include an inorganic insulating material such as a silicon nitride (SiNx), a silicon oxide (SiOx), or a silicon oxynitride (SiOxNy). Alternatively, the partition wall 350 may be formed of a black pixel defining layer (BPDL) including a light blocking material. In this case, the light blocking material may include carbon black, carbon nanotubes, a resin or paste containing a black dye, metal particles such as nickel, aluminum, molybdenum, and alloys thereof, metal oxide particles (e.g., chromium nitride), etc. When the partition wall 350 includes the light-blocking material, it is possible to reduce reflection of external light on metal surfaces disposed under the partition wall 350. However, the present inventive concept is not limited thereto, and the partition wall 350 may not include the light-blocking material, but may include a light-transmitting organic insulating material.

The emission layer 370 may be positioned within the pixel opening 351 of the partition wall 350. The emission layer 370 may overlap the first pixel electrode 191, the scattering layer 193, and the second pixel electrode 195. The emission layer 370 may include an organic material that emits light such as red, green, and blue. The emission layer 370 may include a low-molecular or high-molecular organic material. Although the emission layer 370 is illustrated as a single layer, in reality, auxiliary layers such as an electron injection layer, an electron transport layer, a hole transport layer, and a hole injection layer may also be included above and below the emission layer 370. The hole injection layer and the hole transport layer may be positioned under the emission layer 370, and the electron transport layer and the electron injection layer may be positioned on the emission layer 370.

A common electrode 270 may be positioned on the emission layer 370 and the partition wall 350. The common electrode 270 may be fully positioned in most regions on the substrate 110. The common electrode 270 is also called a cathode, and may include a reflective metal containing including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), etc. or a transparent conductive oxide (TCO) such as ITO (Indium Tin Oxide), IZO (Indium Zinc Oxide), etc.

The first pixel electrode 191, the second pixel electrode 195, the emission layer 370, and the common electrode 270 may form the light-emitting element ED together. In this case, the first pixel electrode 191 and the second pixel electrode 195 may each be an anode which is a hole injection electrode, and the common electrode 270 may be a cathode which is an electron injection electrode. However, the present inventive concept is not limited thereto, and the anode and the cathode may be reversed according to the driving method of the display device.

Holes and electrons are injected into the emission layer 370 from the first and second pixel electrodes 191 and 195, and the common electrode 270, respectively, and light is emitted when excitons which is a bound state of the injected holes and electrons fall from an excited state to a ground state.

Although not shown, an encapsulation layer may be further positioned on the common electrode 270. The encapsulation layer is for protecting the light-emitting element ED from moisture or oxygen that may inflow from the outside, and may include at least one inorganic layer and at least one organic layer. For example, the encapsulation layer may have a shape in which a first inorganic encapsulation layer, an organic encapsulation layer, and a second inorganic encapsulation layer are stacked. However, this is only an example, and the number of inorganic and organic layers constituting the encapsulation layer may be variously changed.

The display device according to an embodiment may include a plurality of pixels, and each pixel may include a plurality of transistors and the light-emitting element connected thereto. Although the structure of one transistor connected to the light-emitting element has been described above, a plurality of transistors may be positioned within one pixel. For example, one pixel may include two transistors and the light-emitting element connected thereto. Some of a plurality of transistors included in one pixel may be formed of a polycrystalline transistor, and another portion may be formed of an oxide transistor.

Next, a manufacturing method of the display device according to an embodiment is described with reference to FIG. 2 to FIG. 12 as follows.

FIG. 2 to FIG. 12 are process cross-sectional views sequentially showing a manufacturing method of a display device according to an embodiment.

Figure 2:
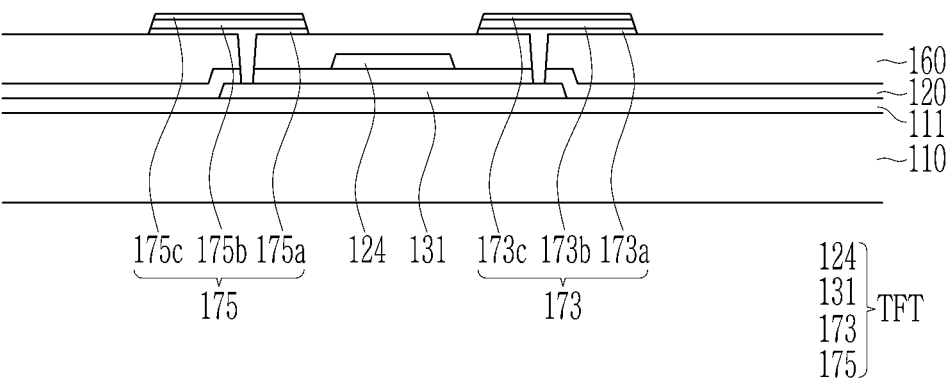
FIG. 2, 3, 4, 5, 6, 7, 8, 9, 10, 11 and FIG. 12 are process cross-sectional views sequentially showing a manufacturing method of a display device according to an embodiment.

First, as shown in FIG. 2, on the substrate 110, a buffer layer 111 is formed by using an inorganic insulating material such as a silicon nitride (SiNx), a silicon oxide (SiOx), or a silicon oxynitride (SiOxNy) or an organic insulating material. The buffer layer 111 may be formed entirely on the substrate 110.

A semiconductor 131 is formed on the buffer layer 111 by using a semiconductor material such as amorphous silicon, polycrystalline silicon, and an oxide semiconductor material. A gate insulating layer 120 is formed on the semiconductor 131 by using an inorganic insulating material such as a silicon nitride (SiNx), a silicon oxide (SiOx), or a silicon oxynitride (SiOxNy).

On the gate insulating layer 120, a gate electrode form 124 is formed by using a metal or metal alloy such as copper (Cu), molybdenum (Mo), aluminum (Al), silver (Ag), chromium (Cr), tantalum (Ta), or titanium (Ti). In this case, the gate electrode 124 may be formed by sequentially depositing two or more metal material layers and then simultaneously patterning them. Subsequently, a doping process or a plasma treatment may be performed. The part of the semiconductor 131 that is covered by the gate electrode 124 is not subjected to the doping process or plasma treatment and may become a channel. The portion of the semiconductor 131 that is not covered by the gate electrode 124 may be doped or plasma-treated to give a conductivity as the conductor, and may be the first region and the second region. The first and second regions of the semiconductor 131 can be positioned on respective sides of the channel. An interlayer insulating layer 160 is formed on the gate electrode 124 by using an inorganic insulating material such as a silicon nitride (SiNx), a silicon oxide (SiOx), or a silicon oxynitride (SiOxNy). Contact holes are formed by patterning the interlayer insulating layer 160 and the gate insulating layer 120 by using a photo and etching process.

On the interlayer insulating layer 160, the source electrode 173 and the drain electrode 175 are formed by using a metal or metal alloy such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta). At this time, two or more metal material layers may be continuously deposited and formed, and then simultaneously patterned to form the source electrode 173 and the drain electrode 175. For example, after sequentially forming a material layer including titanium, a material layer including aluminum, and a material layer including titanium, the source electrode 173 and drain electrode 175 may be formed by patterning these material layers. In this case, the source electrode 173 may be formed of a triple layer including a lower layer 173a, a middle layer 173b, and an upper layer 173c. In addition, the drain electrode 175 may be formed of a triple layer including a lower layer 175a, a middle layer 175b, and an upper layer 175c.

Figure 3:
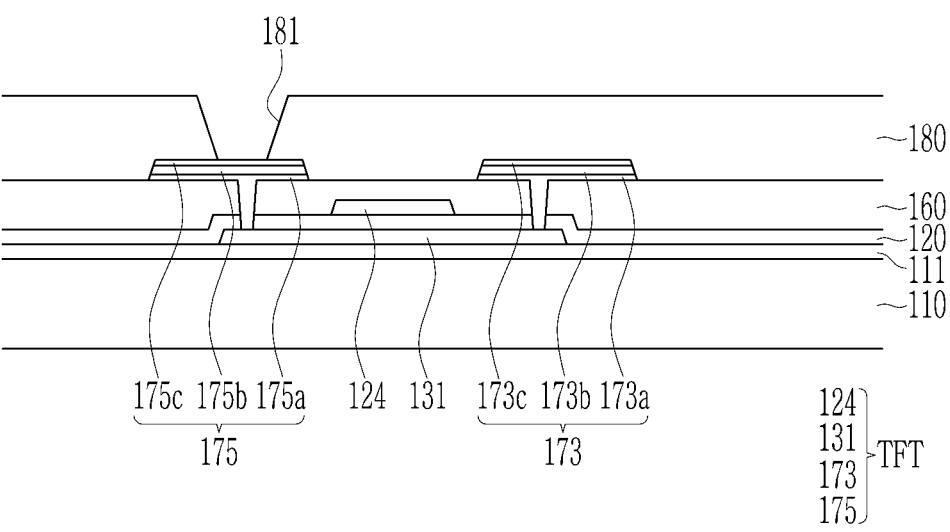

As shown in FIG. 3, on the source electrode 173 and the drain electrode 175, a passivation layer 180 is formed by using an organic insulating material such as general-purpose polymers such as poly(methyl methacrylate) (PMMA) or polystyrene (PS), polymer derivatives with phenolic groups, acryl-based polymers, imide-based polymers, a polyimide, acryl-based polymers, and siloxane-based polymers. The contact hole 181 is formed by patterning the passivation layer 180. The upper surface of the drain electrode 175 may be exposed to the outside by the opening 181. At this time, the upper layer 175c of the drain electrode 175 is exposed by the contact hole 181.

Figure 4:
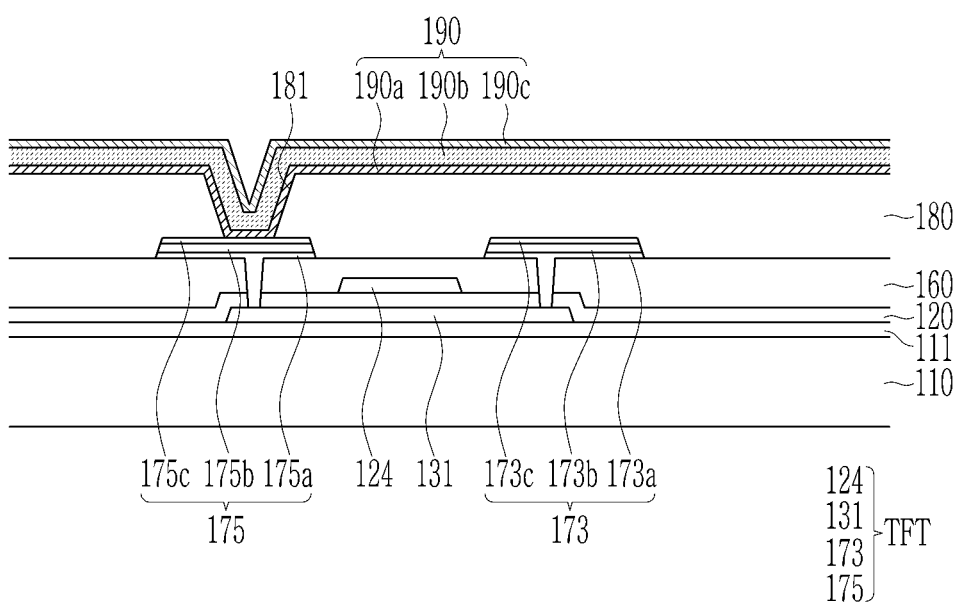

As shown in FIG. 4, a pixel electrode material layer 190 is formed on the passivation layer 180 by using a transparent conductive oxide or a metal material. The pixel electrode material layer 190 may include a lower layer 190a, a middle layer 190b, and an upper layer 190c. The lower layer 190a, the middle layer 190b, and the upper layer 190c may be sequentially formed by a continuous deposition process. The middle layer 190b may be positioned directly on the lower layer 190a, and the upper layer 190c may be positioned directly on the middle layer 190b. In this case, the middle layer 190b of the pixel electrode material layer 190 may be made of a different material from that of the lower layer 190a and the upper layer 190c. The middle layer 190b of the pixel electrode material layer 190 may be made of a metal material, and the lower layer 190a and the upper layer 190c may be made of a transparent conductive oxide. For example, the lower layer 190a may be formed using ITO, the middle layer 190b may be formed using silver (Ag), and the upper layer 190c may be formed using ITO. The pixel electrode material layer 190 may be connected to the drain electrode 175 through the contact hole 181. In this case, the lower layer 190a of the pixel electrode material layer 190 may be in direct contact with the drain electrode 175.

Figure 5:
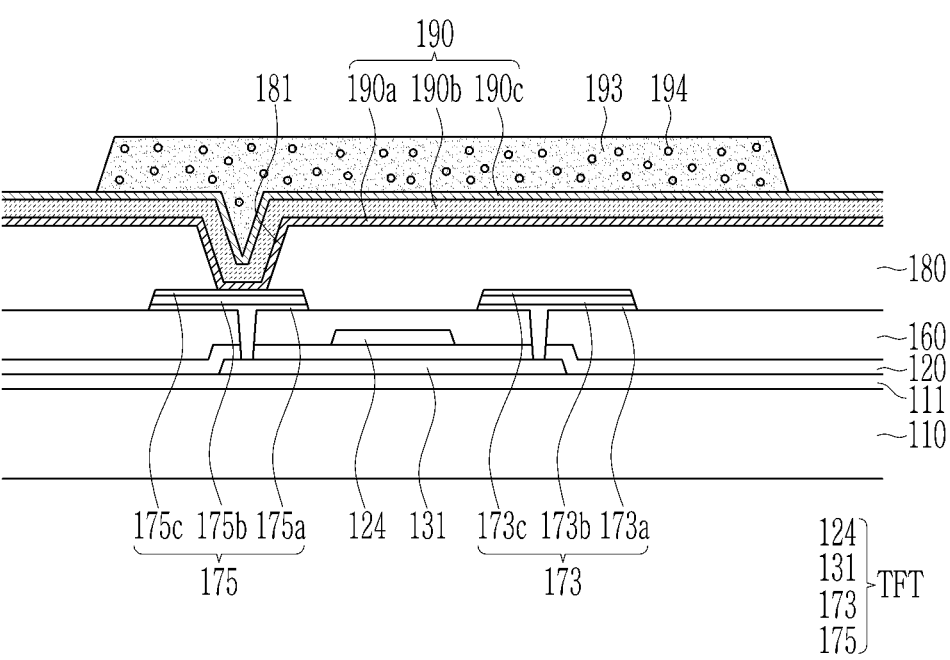

As shown in FIG. 5, a photosensitive resin material including a scatterer 194 is coated on the pixel electrode material layer 190 and patterned using a photo process to form a scattering layer 193. A plurality of scatterers 194 may be positioned inside the photosensitive resin material, and may be evenly distributed. The scatterer 194 may include materials such as $TiO_2$, $SiO_2$, $BaSO_4$, ZnO, $Al_2O_3$, and/or $CaCO_3$. The scattering layer 193 may be positioned directly on the pixel electrode material layer 190. The scattering layer 193 may be in direct contact with an upper surface of the pixel electrode material layer 190. In the process of forming the scattering layer 193, the side surface of the pixel electrode material layer 190 may not be exposed to the outside. In the process of forming the scattering layer 193, the middle layer 190b and the lower layer 190a of the pixel electrode material layer 190 may not be exposed to the outside.

Figure 6:
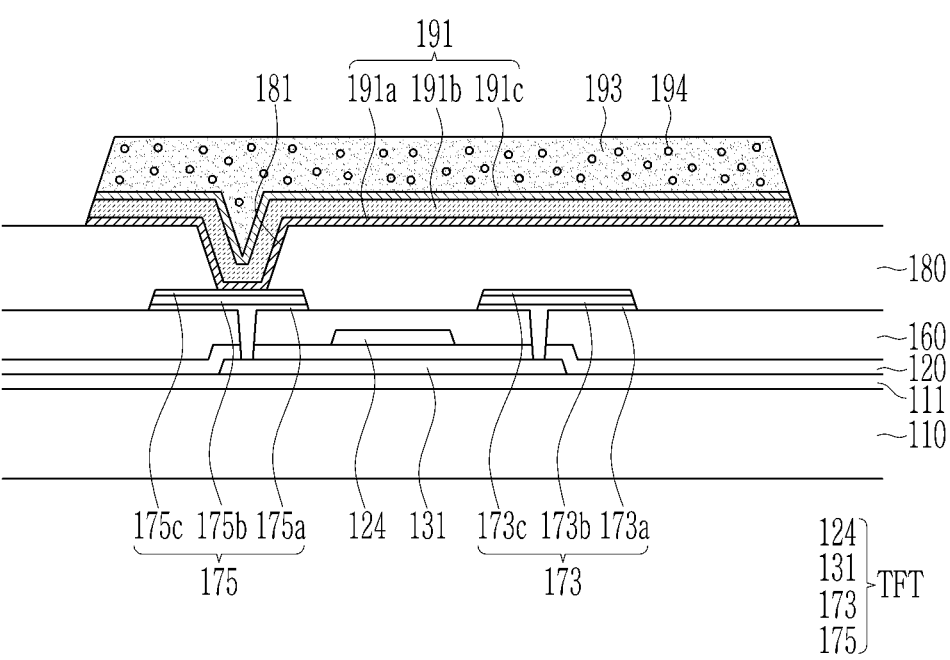
Figure 7:
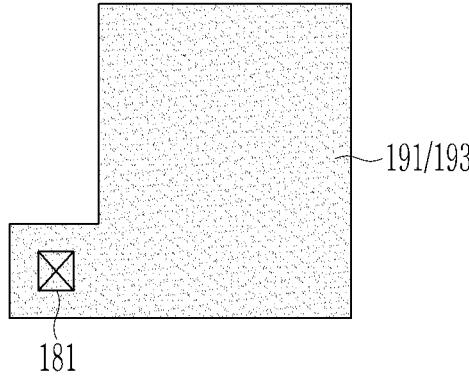

As shown in FIG. 6 and FIG. 7, the pixel electrode material layer 190 is patterned by using the scattering layer 193 as a mask to form a first pixel electrode 191. In this case, the pixel electrode material layer 190 may be patterned using a wet etching process. When the pixel electrode material layer 190 including the lower layer 190a, the middle layer 190b, and the upper layer 190c is patterned, the first pixel electrode 191 including the lower layer 191a, the middle layer 191b, and the upper layer 191c may be formed. The lower layer 191a of the first pixel electrode 191 may be positioned on the passivation layer 180, the middle layer 191b may be positioned on the lower layer 191a, and the upper layer 191c may be positioned on the middle layer 191b. In this case, the middle layer 191b of the first pixel electrode 191 may be made of a different material from that of the lower layer 191a and the upper layer 191c. The middle layer 191b of the first pixel electrode 191 may be made of a metal material, and the lower layer 191a and the upper layer 191c may be made of a transparent conductive oxide. For example, the middle layer 191b may be made of silver (Ag), and the lower layer 191a and the upper layer 191c may be made of ITO. The first pixel electrode 191 may be connected to the drain electrode 175 through the contact hole 181. In this case, the lower layer 191a of the first pixel electrode 191 and the upper layer 175c of the drain electrode 175 may be in contact with each other.

In the manufacturing method of the display device according to an embodiment, the first pixel electrode 191 may be formed by being patterned by using the scattering layer 193 as a mask. Accordingly, the first pixel electrode 191 may have substantially the same planar shape as the scattering layer 193. The scattering layer 193 may cover the upper surface of the first pixel electrode 191. The side surface of the first pixel electrode 191 is not covered by the scattering layer 193 and may be exposed to the outside. In the display device according to the reference example, the scattering layer 193 and the first pixel electrode 191 may have different planar shapes. The scattering layer 193 may have a narrower width than the first pixel electrode 191. The first pixel electrode 191 may be first formed using one mask, and the scattering layer 193 may be formed using another mask. In this case, in the process of forming the scattering layer 193, the side surface of the first pixel electrode 191 may be exposed to a developer and damaged. In particular, a phenomenon in which the middle layer 191b of the first pixel electrode 191 is eroded by the developer may occur. In the manufacturing method of the display device according to an embodiment, by simultaneously forming the first pixel electrode 191 and the scattering layer 193 by using a single mask, the manufacturing process may be simplified, and a cost and time may be reduced. In addition, since the side surface of the first pixel electrode 191 is not exposed to the developer in the process of forming the scattering layer 193, it is possible to prevent the side surface of the first pixel electrode 191 from being damaged.

Figure 8:
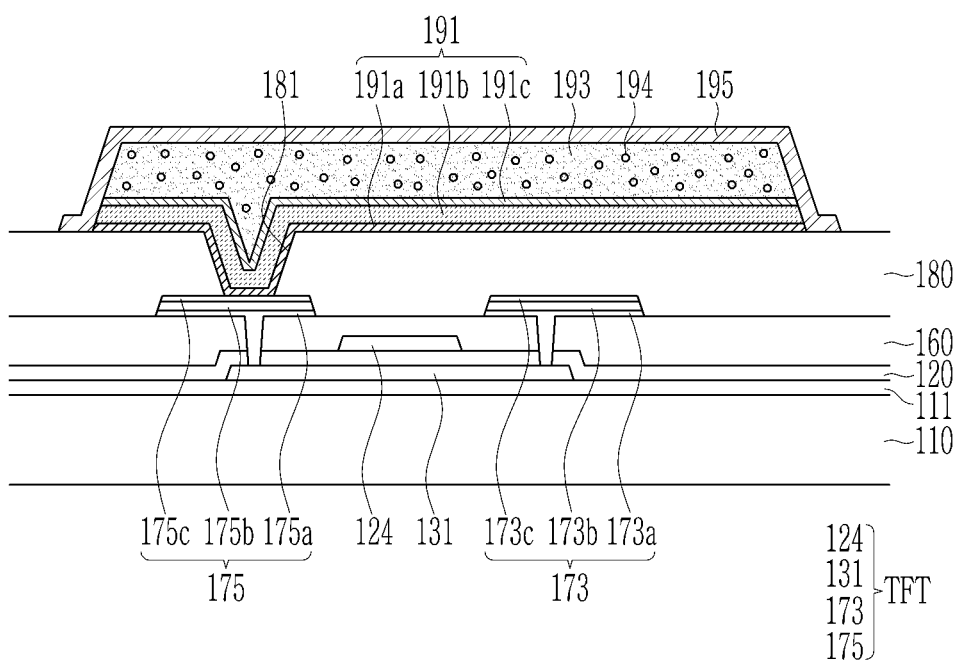
Figure 9:
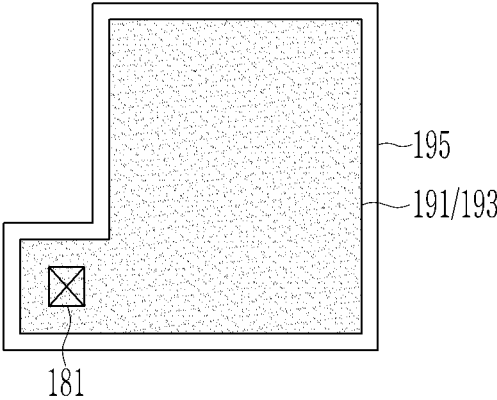

As shown in FIG. 8 and FIG. 9, on the scattering layer 193, a second pixel electrode 195 is formed by using a transparent conductive oxide such as ITO (Indium Tin Oxide), poly-ITO, IZO (Indium Zinc Oxide), IGZO (Indium Gallium Zinc Oxide), and ITZO (Indium Tin Zinc Oxide). The second pixel electrode 195 may cover the upper surface and the side surface of the scattering layer 193. The second pixel electrode 195 may be positioned directly on the scattering layer 193 and may be in direct contact with the scattering layer 193. Also, the second pixel electrode 195 may cover the side surface of the first pixel electrode 191. The second pixel electrode 195 may be in contact with the first pixel electrode 191. The second pixel electrode 195 may have a wider width than the first pixel electrode 191 and the scattering layer 193. The edge of the second pixel electrode 195 may be positioned directly on the passivation layer 180. In the process of forming the second pixel electrode 195, since the side surface of the first pixel electrode 191 is not exposed and is covered by the second pixel electrode 195, it is possible to prevent the first pixel electrode 191 from being damaged by the developer.

Figure 10:
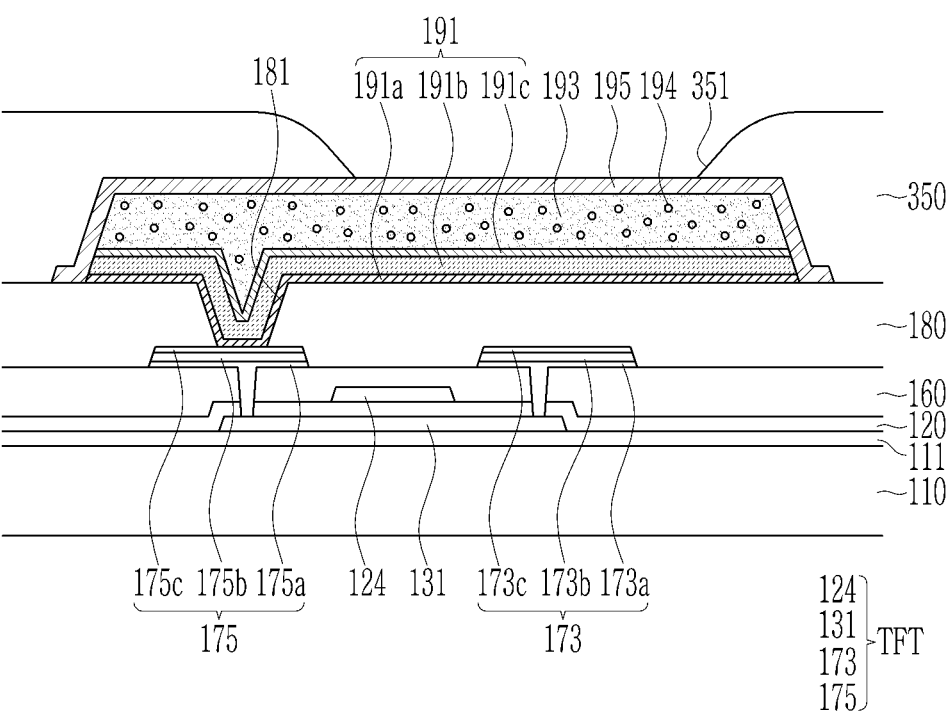
Figure 11:
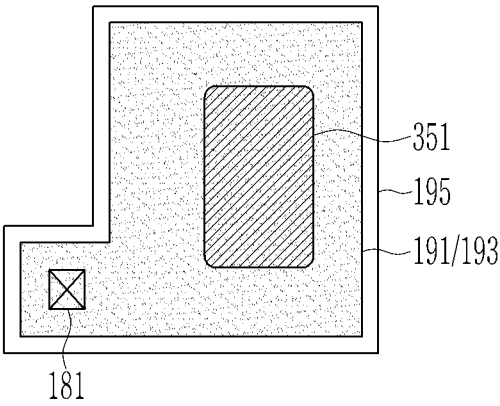

As shown in FIG. 10 and FIG. 11, on the second pixel electrode 195 and the passivation layer 180, a partition wall 350 is formed by using an organic insulating material or an inorganic insulating material. The partition wall 350 may be patterned to form a pixel opening 351. The pixel opening 351 may overlap the first pixel electrode 191, the scattering layer 193, and the second pixel electrode 195. In this case, the pixel opening 351 may overlap the central portions of the first pixel electrode 191, the scattering layer 193, and the second pixel electrode 195, and may not overlap the edge portions of the first pixel electrode 191, the scattering layer 193, and the second pixel electrode 195.

Figure 12:
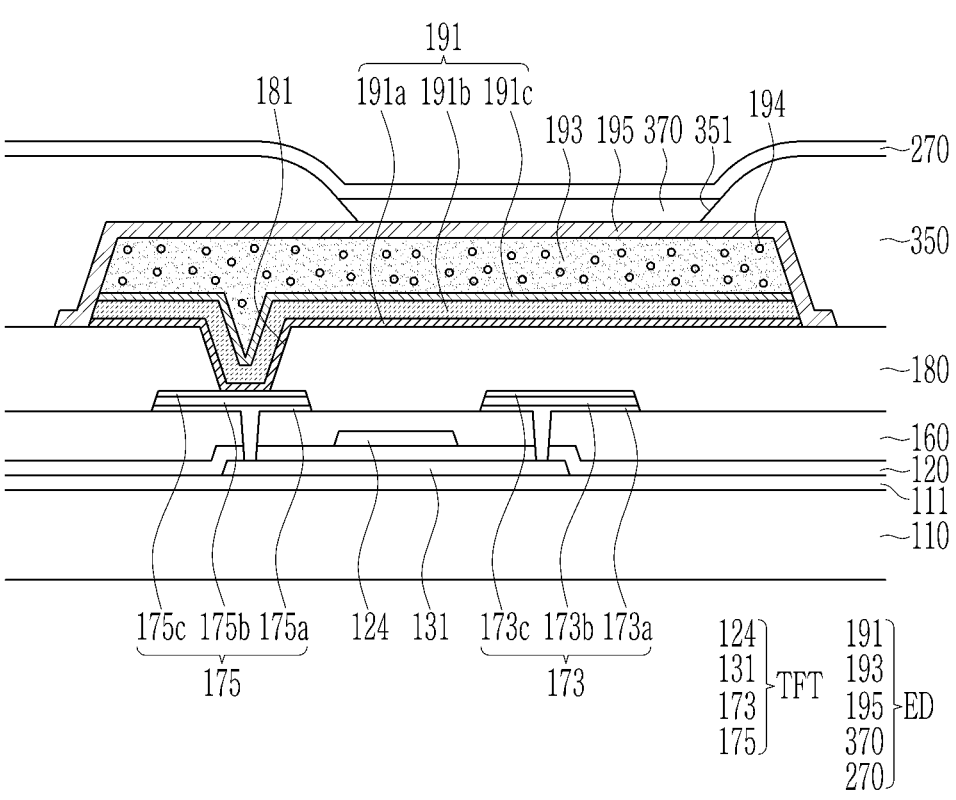

As shown in FIG. 12, an emission layer 370 may be formed in the pixel opening 351. In FIG. 12, the emission layer 370 is shown as a single layer, but in reality, an auxiliary layer such as a hole injection layer (HIL), a hole transporting layer (HTL), an electron transporting layer (ETL), and an electron injection layer (EIL) may be further formed above and below the emission layer 370.

Then, on the emission layer 370 and the partition wall 350, a common electrode 270 is formed using a reflective metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), etc. or a transparent conductive oxide (TCO) such as ITO (Indium Tin Oxide), IZO (Indium Zinc Oxide), etc. The common electrode 270 may be fully positioned in most regions on the substrate 110. The first pixel electrode 191, the second pixel electrode 195, the emission layer 370, and the common electrode 270 may form the light-emitting element ED together.

Although not shown, an encapsulation layer may be formed on the common electrode 270.

Next, a display device according to an embodiment is described with reference to FIG. 13 as follows.

Figure 13:
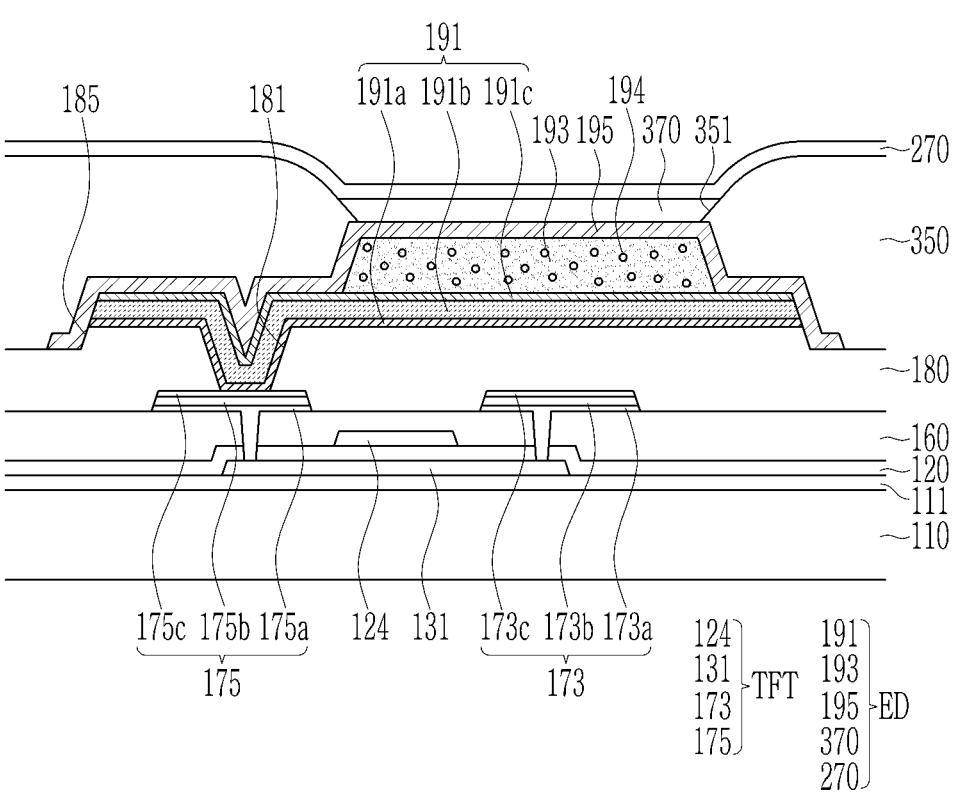
FIG. 13 is a cross-sectional view showing a display device according to an embodiment.

Since the display device according to the embodiment shown in FIG. 13 is substantially the same part as the display device according to the embodiment shown in FIG. 1, the description of the same parts is omitted. The present embodiment is different from the previous embodiment in that the first pixel electrode and the scattering layer have different planar shapes, and is further described below.

FIG. 13 is a cross-sectional view showing a display device according to an embodiment.

As shown in FIG. 13, a display device according to an embodiment includes a substrate 110, a transistor TFT positioned on the substrate 110, and a light-emitting element ED connected to the transistor TFT.

A buffer layer 111 may be positioned on the substrate 110. On the buffer layer 111, a transistor TFT including a semiconductor 131, a gate electrode 124 overlapping the semiconductor 131, and a source electrode 173 and a drain electrode 175 connected to the semiconductor 131 may be positioned.

A passivation layer 180 is positioned on the source electrode 173 and the drain electrode 175. In the preceding embodiment, the passivation layer 180 may have a constant thickness, and in the present embodiment, the passivation layer 180 may have a different thickness depending on the position. A trench 185 may be formed in the passivation layer 180. The thickness of the portion of the passivation layer 180 where the trench 185 is formed may be thinner than the remaining portion.

A light-emitting element ED including a first pixel electrode 191, a scattering layer 193, a second pixel electrode 195, an emission layer 370, and a common electrode 270 may be positioned on the passivation layer 180.

The first pixel electrode 191 may be positioned directly on the passivation layer 180. The first pixel electrode 191 may be connected to the drain electrode 175 through the contact hole 181 formed in the passivation layer 180. The first pixel electrode 191 may be positioned on the portion of the passivation layer 180 where the trench 185 is not formed. That is, the first pixel electrode 191 may not overlap the trench 185. The trench 185 may be positioned on both sides of the first pixel electrode 191, and the first pixel electrode 191 may be surrounded by the trench 185 on a plane. The thickness of the portion of the passivation layer 180 that overlaps the first pixel electrode 191 may be thicker than the thickness of the portion of the passivation layer 180 that does not overlap the first pixel electrode 191.

A scattering layer 193 may be positioned on the first pixel electrode 191. In the preceding embodiment, the scattering layer 193 may have substantially the same planar shape as that of the first pixel electrode 191, and in the present embodiment, the scattering layer 193 may have a different planar shape than the first pixel electrode 191. The width of the scattering layer 193 may be narrower than the width of the first pixel electrode 191. The scattering layer 193 may overlap the partial region of the first pixel electrode 191. The scattering layer 193 may overlap the central portion of the first pixel electrode 191. The central portion of the first pixel electrode 191 may be covered by the scattering layer 193, and the edge portion of the first pixel electrode 191 may not be covered by the scattering layer 193.

A second pixel electrode 195 may be positioned on the first pixel electrode 191 and the scattering layer 193. The second pixel electrode 195 may cover an upper surface and a side surface of the scattering layer 193. The second pixel electrode 195 may be positioned directly on the scattering layer 193 and may be in direct contact with the scattering layer 193. Also, the second pixel electrode 195 may cover the upper surface and the side surface of the first pixel electrode 191. The second pixel electrode 195 may be in direct contact with the first pixel electrode 191. In the preceding embodiment, the second pixel electrode 195 may be in direct contact with the side surface of the first pixel electrode 191, and in the present embodiment, the second pixel electrode 195 may be in direct contact with the side surface of the first pixel electrode 191 and the upper surface of the first pixel electrode 191. In this case, the portion of the first pixel electrode 191 not covered by the scattering layer 193, that is, the upper surface and the side surface of the edge portion of the first pixel electrode 191, may be in direct contact with the second pixel electrode 195. In the present embodiment, as the contact area between the second pixel electrode 195 and the first pixel electrode 191 increases, the resistance may decrease. The second pixel electrode 195 may have a wider width than the first pixel electrode 191 and the scattering layer 193. The edge of the second pixel electrode 195 may be positioned directly on the passivation layer 180. The second pixel electrode 195 may also be positioned in the trench 185 of the passivation layer 180. The second pixel electrode 195 may cover the side wall of the trench 185 of the passivation layer 180, and may also be positioned on the bottom surface of the portion of the trench 185 adjacent to the first pixel electrode 191.

A partition wall 350 may be positioned on the second pixel electrode 195. The partition wall 350 may include a pixel opening 351, and the pixel opening 351 may overlap the first pixel electrode 191, the scattering layer 193, and the second pixel electrode 195. The emission layer 370 may be positioned within the pixel opening 351 of the partition wall 350. A common electrode 270 may be positioned on the emission layer 370 and the partition wall 350.

Next, the manufacturing method of the display device according to an embodiment is described with reference to FIG. 14 to FIG. 24 as follows.

FIG. 14 to FIG. 24 are process cross-sectional views sequentially showing a manufacturing method of a display device according to an embodiment.

Figure 14:
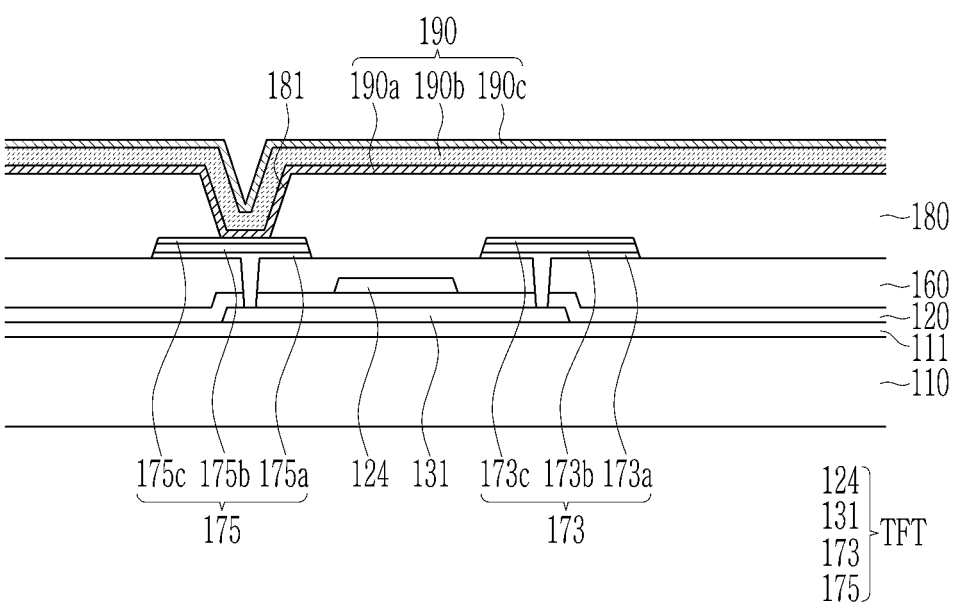
FIG. 14, 15, 16, 17, 18, 19, 20, 21, 22, 23 and FIG. 24 are process cross-sectional views sequentially showing a manufacturing method of a display device according to an embodiment.

First, as shown in FIG. 14, a buffer layer 111 is formed on a substrate 110, and a transistor TFT including a semiconductor 131, a gate electrode 124, a source electrode 173, and a drain electrode 175 is formed on the buffer layer 111. A passivation layer 180 is formed on the source electrode 173 and the drain electrode 175, and a contact hole 181 is formed by patterning the passivation layer 180.

Next, a pixel electrode material layer 190 is formed on the passivation layer 180 by using a transparent conductive oxide or a metal material. The pixel electrode material layer 190 may include a lower layer 190a, a middle layer 190b, and an upper layer 190c. The lower layer 190a, the middle layer 190b, and the upper layer 190c may be sequentially formed by a continuous deposition process.

Figure 15:
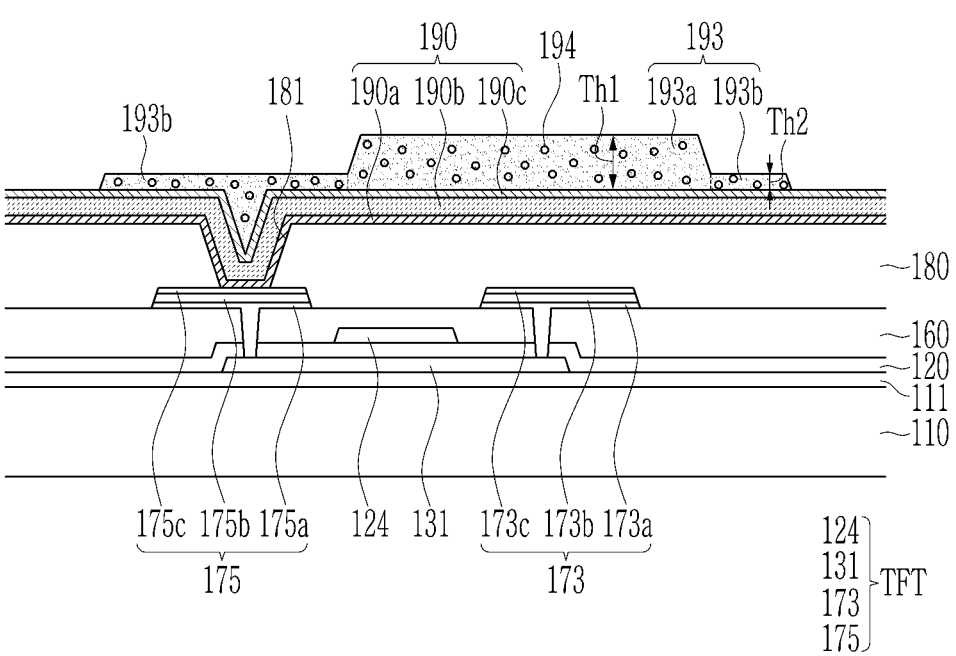

As shown in FIG. 15, a photosensitive resin material including a scatterer 194 is applied on the pixel electrode material layer 190 and patterned using a photo process to form a scattering layer 193. In the photo process, an exposure process may be performed using a halftone mask or a slit mask. Referring to the thickness of the scattering layer 193 after the photo process, in the preceding embodiment, the scattering layer 193 may have the substantially constant thickness, and in the present embodiment, the scattering layer 193 may have the different thickness depending on the position. The scattering layer 193 may include a first portion 193a having a first thickness Th1 and a second portion 193b having a second thickness Th2. The first thickness Th1 may be thicker than the second thickness Th2. The first portion 193a may correspond to the center of the scattering layer 193, and the second portion 193b may be positioned on both sides of the first portion 193a. The first portion 193a may be surrounded by the second portion 193b. A scattering layer 193 may be positioned directly on the pixel electrode material layer 190. The scattering layer 193 may be in direct contact with the upper surface of the pixel electrode material layer 190. In the process of forming the scattering layer 193, the side surface of the pixel electrode material layer 190 may not be exposed to the outside. In the process of forming the scattering layer 193, the middle layer 190b and the lower layer 190a of the pixel electrode material layer 190 may not be exposed to the outside.

Figure 16:
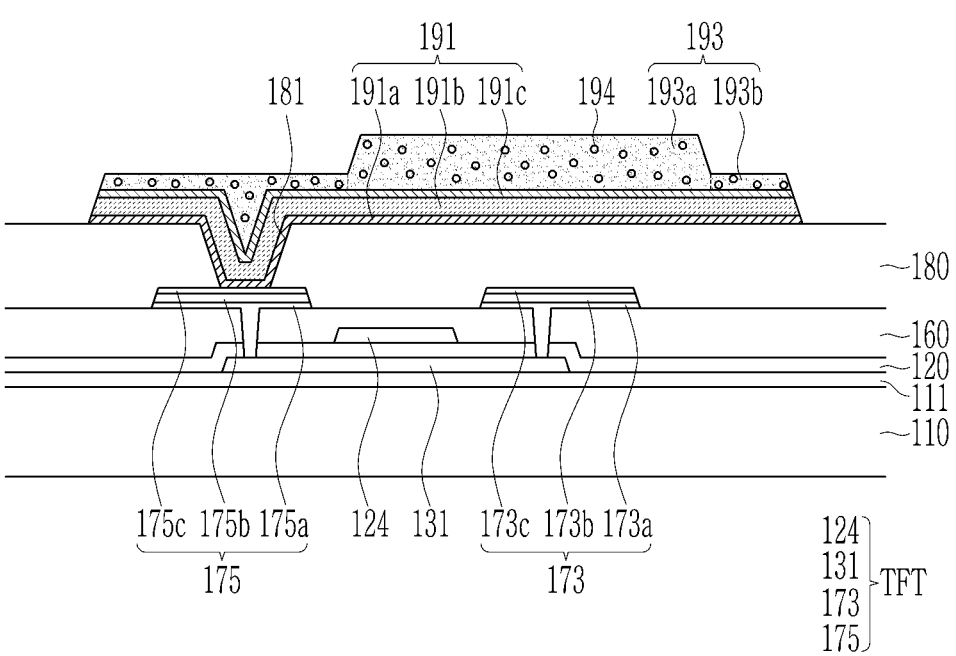
Figure 17:
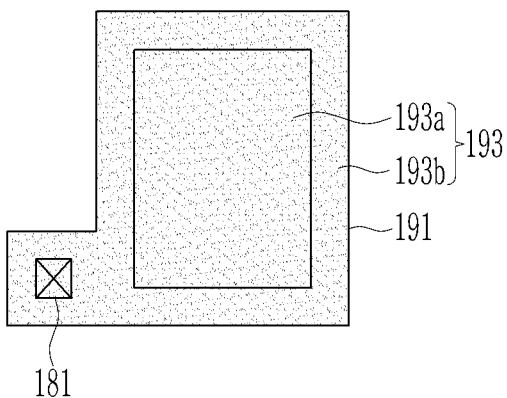

As shown in FIG. 16 and FIG. 17, the first pixel electrode 191 is formed by patterning the pixel electrode material layer 190 by using the scattering layer 193 as a mask. In this case, the pixel electrode material layer 190 may be patterned using a wet etching process. When the pixel electrode material layer 190) including the lower layer 190a, the middle layer 190b, and the upper layer 190c is patterned, the first pixel electrode 191 including the lower layer 191a, the middle layer 191b, and the upper layer 191c may be formed. The lower layer 191a of the first pixel electrode 191 may be positioned on the passivation layer 180, the middle layer 191b may be positioned on the lower layer 191a, and the upper layer 191c may be positioned on the middle layer 191b. In this case, the middle layer 191b of the first pixel electrode 191 may be made of a metal material, and the lower layer 191a and the upper layer 191c may be made of a transparent conductive oxide.

In the manufacturing method of the display device according to an embodiment, the first pixel electrode 191 may be formed by patterning using the scattering layer 193 as a mask. Accordingly, in this step, the first pixel electrode 191 may have substantially the same planar shape as the scattering layer 193. In a later step, the planar shapes of the first pixel electrode 191 and the scattering layer 193 may be different, which will be described later. The first pixel electrode 191 may overlap the first portion 193a and the second portion 193b of the scattering layer 193. The scattering layer 193 may cover the upper surface of the first pixel electrode 191. The side surface of the first pixel electrode 191 is not covered by the scattering layer 193 and may be exposed to the outside. In the display device according to the reference example, the first pixel electrode 191 may be first formed using one mask, and the scattering layer 193 may be formed using another mask. In this case, in the process of forming the scattering layer 193, the side surface of the first pixel electrode 191 may be exposed to the developer and damaged. In particular, a phenomenon in which the middle layer 191b of the first pixel electrode 191 is eroded by the developer may occur. In the manufacturing method of a display device according to an embodiment, by simultaneously forming the first pixel electrode 191 and the scattering layer 193 by using a single mask, the manufacturing process may be simplified, and the cost and time may be reduced. In addition, since the side surface of the first pixel electrode 191 is not exposed to the developer in the process of forming the scattering layer 193, it is possible to prevent the side surface of the first pixel electrode 191 from being damaged.

Figure 18:
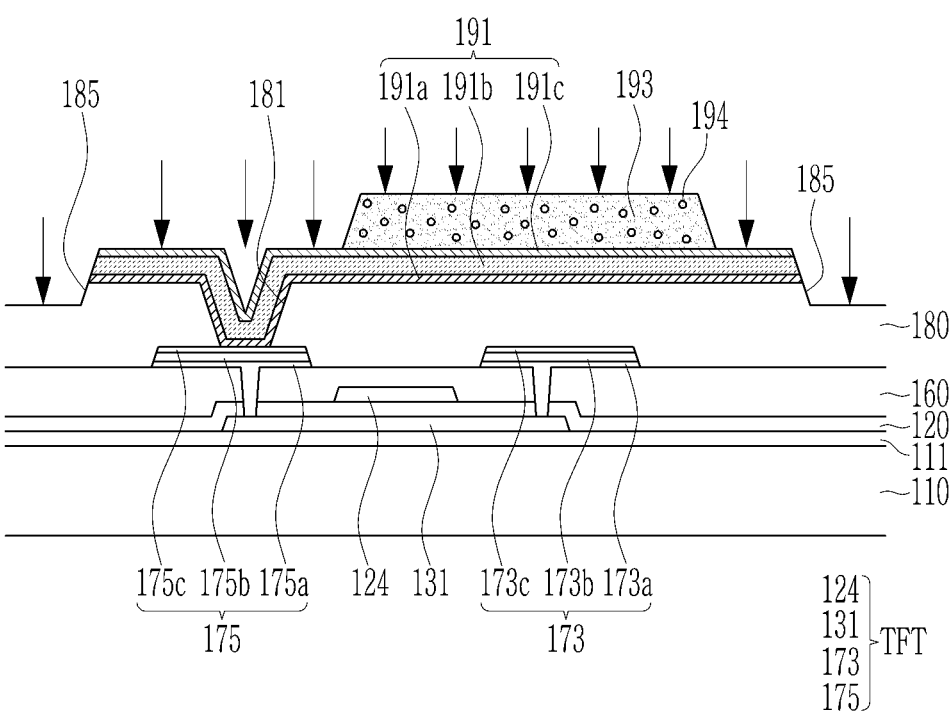
Figure 19:
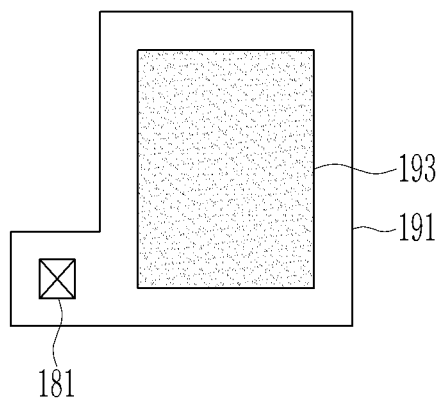

As shown in FIG. 18 and FIG. 19, at least a partial region of the scattering layer 193 is removed by performing an etch-back process. In the etch-back process, the entire region may be etched without using a separate mask. In this case, a dry etching process may be used. The relatively thin second portion 193b of the scattering layer 193 may be completely removed. The thickness of the first portion 193a of the scattering layer 193 is reduced. Accordingly, the planar shape of the scattering layer 193 and the planar shape of the first pixel electrode 191 may be different. The width of the scattering layer 193 may be narrower than the width of the first pixel electrode 191. The scattering layer 193 may overlap the partial region of the first pixel electrode 191. The scattering layer 193 may overlap the central portion of the first pixel electrode 191. The central portion of the first pixel electrode 191 may be covered by the scattering layer 193, and the edge portion of the first pixel electrode 191 may not be covered by the scattering layer 193.

The portion where the passivation layer 180 is not covered by the first pixel electrode 191 and is exposed may also be etched. Accordingly, the trench 185 may be formed in the passivation layer 180. The thickness of the portion of the passivation layer 180 where the trench 185 is formed may be thinner than the remaining portion. The trench 185 may not overlap the first pixel electrode 191. The thickness of the portion of the passivation layer 180 that overlaps the first pixel electrode 191 may be thicker than the thickness of the portion of the passivation layer 180 that does not overlap the first pixel electrode 191.

Figure 20:
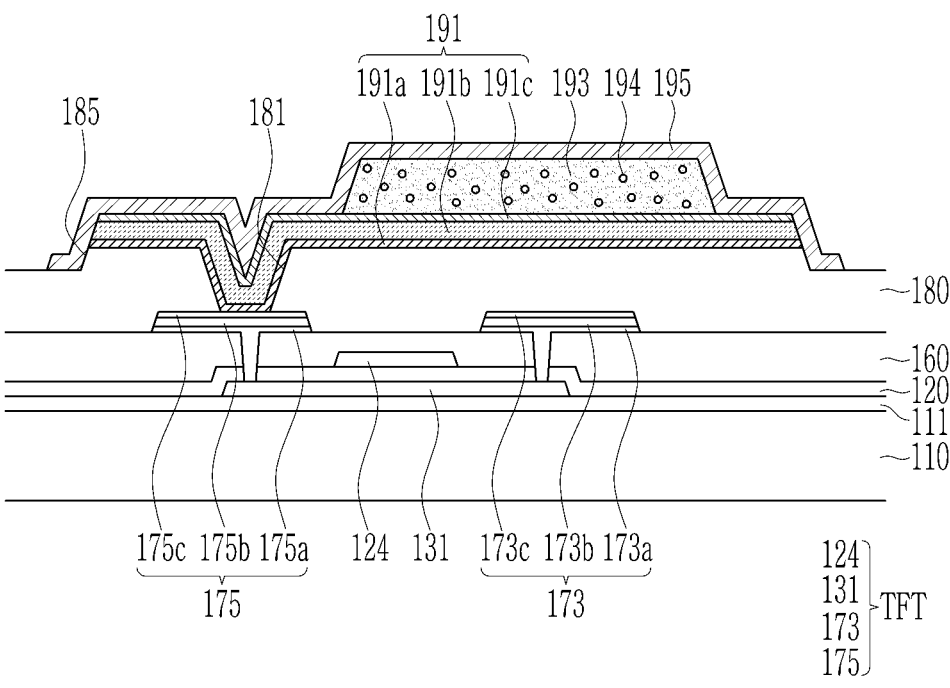
Figure 21:
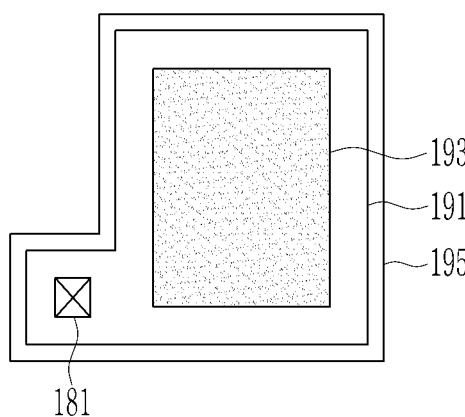

As shown in FIG. 20 and FIG. 21, the second pixel electrode 195 is formed on the scattering layer 193, the first pixel electrode 191, and the passivation layer 180. The second pixel electrode 195 may cover the upper surface and the side surface of the scattering layer 193. The second pixel electrode 195 may be positioned directly on the scattering layer 193 and may be in direct contact with the scattering layer 193. Also, the second pixel electrode 195 may cover the upper surface and the side surface of the first pixel electrode 191. The second pixel electrode 195 may be in contact with the first pixel electrode 191. In this case, the portion of the first pixel electrode 191 not covered by the scattering layer 193, that is, the upper surface and the side surface of the edge portion of the first pixel electrode 191, may be in contact with the second pixel electrode 195. The edge of the second pixel electrode 195 may be positioned directly on the passivation layer 180. The second pixel electrode 195 may also be positioned in the trench 185 of the passivation layer 180. The second pixel electrode 195 may cover the side wall of the trench 185 of the passivation layer 180, and may also be positioned on the bottom surface of the portion of the trench 185 adjacent to the first pixel electrode 191. In the process of forming the second pixel electrode 195, since the side surface of the first pixel electrode 191 is not exposed and is covered by the second pixel electrode 195, the first pixel electrode 191 may be prevented from being damaged by the developer.

Figure 22:
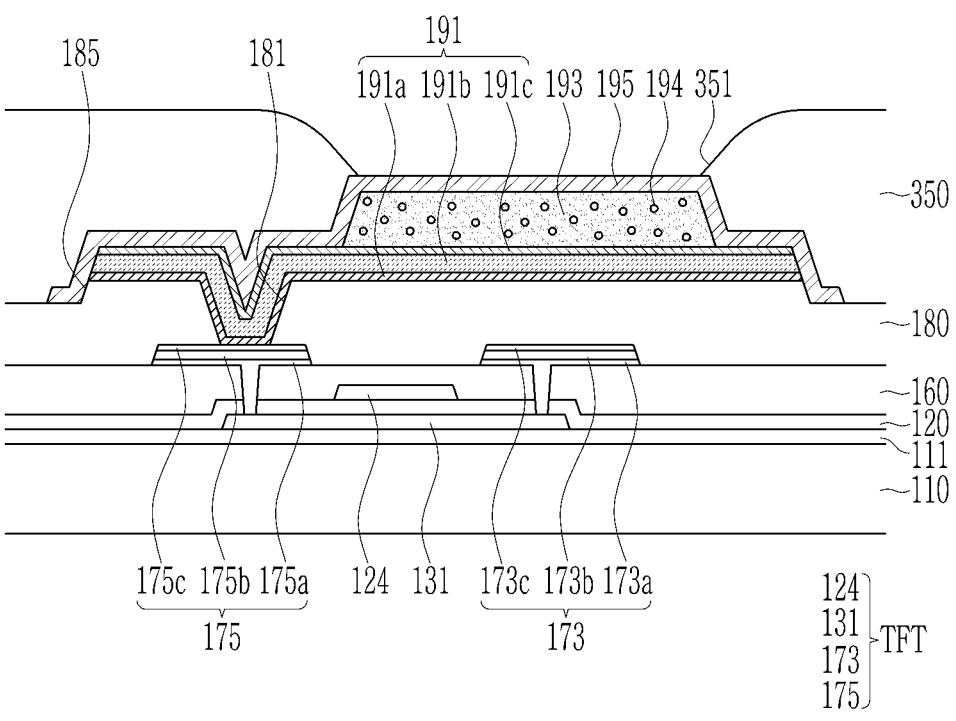
Figure 23:
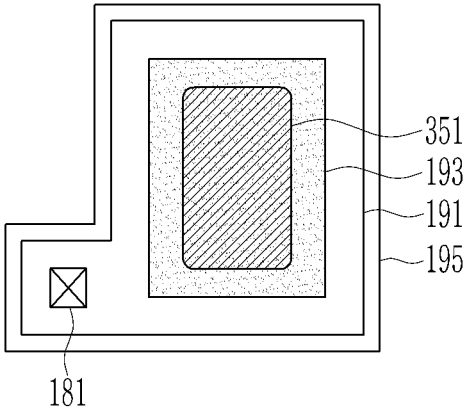

As shown in FIG. 22 and FIG. 23, a partition wall 350 is formed on the second pixel electrode 195 and the passivation layer 180, and a pixel opening 351 is formed by patterning a partition wall material. In this case, the pixel opening 351 may overlap the central portions of the first pixel electrode 191, the scattering layer 193, and the second pixel electrode 195.

Figure 24:
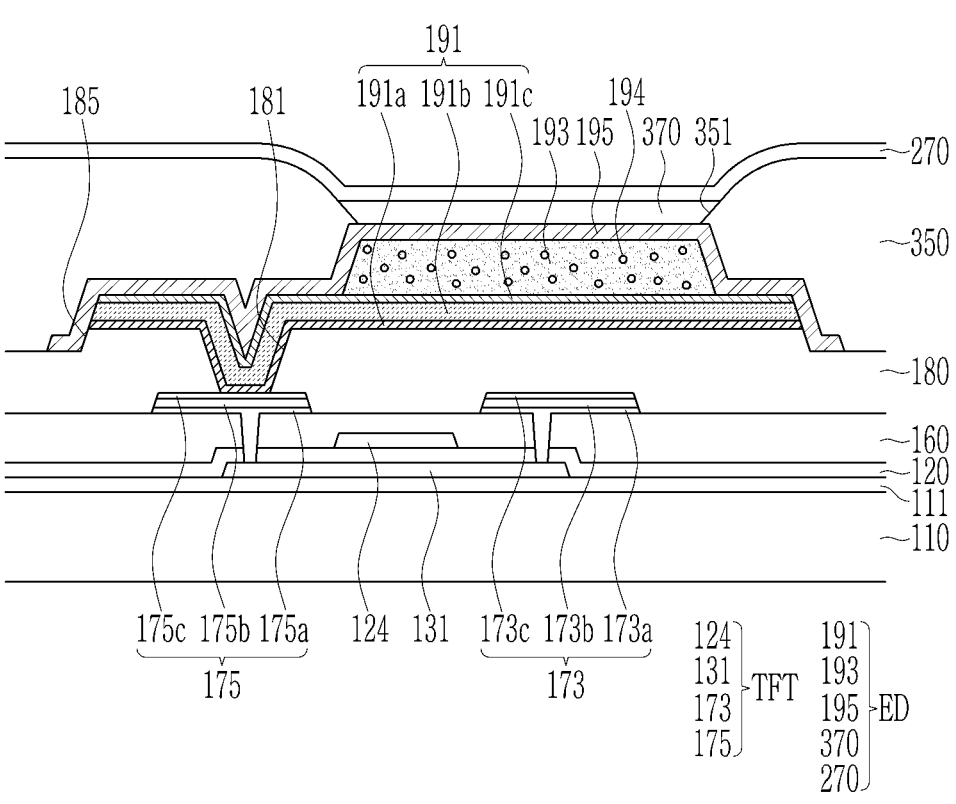

As shown in FIG. 24, an emission layer 370 is formed in the pixel opening 351. Next, a common electrode 270 is formed on the emission layer 370 and the partition wall 350.

Although not shown, an encapsulation layer may be formed on the common electrode 270.

While this disclosure has been described in connection with what is presently considered to be practical embodiments, it is to be understood that the inventive concept is not limited to the disclosed embodiments. On the contrary, it is intended to cover various modifications and equivalent arrangements included within the spirit and scope of the appended claims.

What is claimed is:

1. A display device comprising:
   a substrate;
   a transistor positioned on the substrate;
   a first pixel electrode connected to the transistor;
   a scattering layer positioned on the first pixel electrode;
   a second pixel electrode positioned on the scattering layer and covering an entire side surface of the first pixel electrode;
   an emission layer positioned on the second pixel electrode; and
   a common electrode positioned on the emission layer.

2. The display device of claim 1, wherein the second pixel electrode is in direct contact with the side surface of the first pixel electrode.

3. The display device of claim 2, wherein the second pixel electrode has a wider width than that of the first pixel electrode.

4. The display device of claim 1, wherein the scattering layer has the same planar shape as the first pixel electrode.

5. The display device of claim 1, further comprising a passivation layer positioned between the transistor and the first pixel electrode,
   wherein an edge of the second pixel electrode is in direct contact with the passivation layer.

6. The display device of claim 5, wherein the second pixel electrode is in direct contact with an upper surface and side surfaces of the first pixel electrode not covered by the scattering layer.

7. The display device of claim 6, wherein the passivation layer includes a trench, a thickness of a part of the passivation layer where the trench is formed is thinner than a thickness of the rest of the passivation layer, the trench does not overlap the first pixel electrode, and the edge of the second pixel electrode covers a side wall and a bottom of the trench.

8. The display device of claim 7, wherein a width of the scattering layer is narrower than the width of the first pixel electrode.

9. The display device of claim 1, wherein the first pixel electrode includes a lower layer, a middle layer, and an upper layer, and
   the middle layer of the first pixel electrode includes a metal material, and the lower layer and the upper layer of the first pixel electrode include a transparent conductive oxide.

10. The display device of claim 1, wherein the scattering layer includes a photosensitive resin and a plurality of scatterers positioned inside the photosensitive resin.

* * * * *